United States Patent
Barnum et al.

(10) Patent No.: US 6,853,196 B1
(45) Date of Patent: Feb. 8, 2005

(54) METHOD AND APPARATUS FOR ELECTRICAL CABLE TESTING BY PULSE-ARRESTED SPARK DISCHARGE

(75) Inventors: John R. Barnum, Albuquerque, NM (US); Larry K. Warne, Albuquerque, NM (US); Roy E. Jorgenson, Albuquerque, NM (US); Larry X. Schneider, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 113 days.

(21) Appl. No.: 10/122,448

(22) Filed: Apr. 12, 2002

(51) Int. Cl.$^7$ .................. G01R 31/11; G01R 31/08; G01R 27/32
(52) U.S. Cl. .................. 324/543; 324/533; 324/532; 324/644; 324/535; 324/534
(58) Field of Search .................. 324/543, 644, 324/534, 533, 532, 535

(56) References Cited

U.S. PATENT DOCUMENTS

| | | | | |
|---|---|---|---|---|
| 5,418,463 A | * | 5/1995 | Fleming et al. | 324/520 |
| 5,530,365 A | * | 6/1996 | Lefeldt | 324/536 |
| 5,682,100 A | * | 10/1997 | Rossi et al. | 324/535 |
| 5,717,337 A | | 2/1998 | Kelly | 324/534 |
| 5,726,574 A | * | 3/1998 | Silverberg et al. | 324/529 |
| 6,194,902 B1 | * | 2/2001 | Kuo et al. | 324/637 |
| 6,225,811 B1 | | 5/2001 | Bruning et al. | 324/544 |

OTHER PUBLICATIONS

Barnum et al., "Program Plan for the Cable Life Assessment and Condition Monitoring Program," Project and Status Report to the U.S. Dept. of Energy, Office of Nuclear Energy, Science, and Technology; Cable Life and Condition Monitoring Program, Jan. 9, 1997.

Barnum et al., "Electrical NDE Techniques (Task 4)," Project Briefing to the U.S. Dept. of Energy, Office of Nuclear Energy, Science, and Technology, Jun. 13, 1997.

Schneider, "An Integrated Solution to the Evaluation of Aging Wiring Systems in Commercial Aircraft," Proposal to the U.S. Federal Aviation Administration, Nov. 12, 1998.

Schneider, "An Integrated Solution to the Functional Assessment of Electrical Cable Systems," Project Plan for Proposal to U.S. Dept. of Energy, Office of Nuclear Energy, Science, and Technology, Jan. 25, 1999.

Dinallo and Schneider, "Pulsed Arrested Spark Discharge (PASD) Diagnostic Technique for the Location of Defects in Aging Wiring Systems," Sandia Report SAND2001–3225, Oct., 2001.

* cited by examiner

Primary Examiner—Jay Patidar
Assistant Examiner—John Teresinski
(74) Attorney, Agent, or Firm—Kevin W. Bieg (57) ABSTRACT

A method for electrical cable testing by Pulse-Arrested Spark Discharge (PASD) uses the cable response to a short-duration high-voltage incident pulse to determine the location of an electrical breakdown that occurs at a defect site in the cable. The apparatus for cable testing by PASD includes a pulser for generating the short-duration high-voltage incident pulse, at least one diagnostic sensor to detect the incident pulse and the breakdown-induced reflected and/or transmitted pulses propagating from the electrical breakdown at the defect site, and a transient recorder to record the cable response. The method and apparatus are particularly useful to determine the location of defect sites in critical but inaccessible electrical cabling systems in aging aircraft, ships, nuclear power plants, and industrial complexes.

48 Claims, 9 Drawing Sheets

FIG. 9B

METHOD AND APPARATUS FOR ELECTRICAL CABLE TESTING BY PULSE-ARRESTED SPARK DISCHARGE

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to the field of electrical cable testing and, more particularly, to the detection of a defect site in a cable by forced electrical breakdown of the defect site using a short-duration, high-voltage incident pulse and time-of-arrival measurement of the resulting breakdown signals.

BACKGROUND OF THE INVENTION

Critical electrical cable and wiring systems in aging aircraft, ships, nuclear power plants, and industrial complexes are a growing concern due to risk of failure from prolonged environmental stresses, such as thermal and mechanical cycling, and electrical stress. Such applications have mission or safety critical cable infrastructures that must function without fault during normal operations and possibly during an abnormal event.

Examples of safety critical electrical cabling in commercial and military aircraft are the flight control systems. During operations, aircraft environments include vibration and thermal variations, which can result in an accumulation of damage to a cable. It is critical that the damaged cable be identified and replaced or repaired. If the defect is left undetected, the environmental degradation will continue, and the accumulated damage could eventually result in a critical fault if not corrected.

An example of environment stress in the nuclear power industry is thermal embrittlement that can result in cracking of insulation in control cables. The damaged cable may never fail under normal operation. However, during an earthquake the shifting of cables in a tray and breaking away of the embrittled insulation could result in an immediate failure. Depending on the critical nature of the cable, it may not be necessary to immediately replace the damaged cable. With the low probability of a failure scenario, cable replacement could occur during normal maintenance operation. If facility operators knew the condition of the cables and the location of the defects, they could make informed decisions on repair methodologies.

In general, these critical electrical cable systems are inaccessible over their length, providing very limited visual or physical inspection of the system. Nondestructive and nonintrusive condition monitoring (CM) techniques are needed to locate insulation degradation and defects in such inaccessible cable systems.

Despite the compelling need for CM tools to evaluate the reliability of critical cable systems, validated CM technologies have not been developed because of the complexity of the problem. A variety of commercial and exploratory tools are available that provide information on bulk cable properties, but no validated CM technique is available for locating insulation degradations in complex cable systems. One technique that has been proposed is partial discharge. The partial discharge technique, however, has not been demonstrated to function outside of highly controlled laboratory environments. Other CM techniques that have been proposed, and in some cases implemented, use continuous application of high voltage and immersion of the wiring or cable system in water or ionizing gas to enhance the possibility of electrical breakdown at defect sites. However, these techniques have limited applicability because of the requirement for water or gas immersion. Nor have these techniques been demonstrated to be non-damaging to the cables under test.

The present invention, hereinafter referred to as Pulsed-Arrested Spark Discharge (PASD), is potentially capable of in-situ, nondestructive detection and location of insulation defects in complex cable systems. The PASD method has possible utility in any operation that has electrical cable systems that must be evaluated to determine the presence of defects or degradations.

SUMMARY OF THE INVENTION

The present invention is directed to a method and apparatus for electrical cable testing by PASD. Pulse arrested refers to the application of a short-duration, high-voltage pulse to a cable that results in an electrical breakdown (spark discharge) as a defect site. The method for determining the location of a defect site in a cable comprises injecting into the drive end of the cable a short-duration incident pulse having sufficient voltage to cause an electrical breakdown at the defect site. The electrical breakdown, in turn, generates pulses which propagate away from the defect site in both directions along the cable. The pulse that propagates back from the defect site toward the drive end of the cable is referred to as the breakdown-induced reflected pulse. The pulse that propagates from the defect site to the terminal end of the cable is referred to as the breakdown-induced transmitted pulse.

To determine the location of the defect site, at least one diagnostic sensor can detect the incident pulse at the drive end of the cable, which provides a time reference. The pulses generated by the electrical breakdown at the defect site can be detected by the diagnostic sensor(s). The location of the defect site can be determined from the difference in arrival times between the incident pulse and the breakdown-induced reflected and/or transmitted pulses and the propagation velocity of the pulses in the cable.

The incident pulse comprises a short-duration high-voltage pulse having a risetime that can be as long as 10 nanoseconds, but preferably less than 1 nanosecond. The pulsewidth of the incident pulse can be 500 nanoseconds, but preferably less than 10 nanoseconds. The fact that the incident pulse is relatively narrow implies that the total energy delivered to the defect site will be small, even though the applied voltage can be high.

Techniques to either enhance or inhibit the onset of electrical breakdown can be used with the basic PASD method to assist in determining the location of the defect site. These techniques include: 1) the use of an external ionization source to lower the breakdown voltage at the defect site; 2) the application of multiple incident pulses to preionize the defect site and reduce the required voltage, wherein the pulses can be of the same or opposite polarity; 3) the application of multiple incident pulses to force multiple breakdowns at the defect site, enabling the use of repetitive data extraction techniques; 4) the application of multiple incident pulse injection from both ends of the cable to reduce voltage in the cable and at the injection points, yet provide voltage doubling at the defect location; 5) the use of localized magnetic fields to suppress breakdown at specified locations along the cable and improve defect location precision; and 6) the use of pressure changes and liquid or gas immersion to change the breakdown threshold.

The apparatus for determining the location of a defect in an electrical cable comprises a pulser for injecting a short-duration incident pulse into the drive end of the cable having sufficient voltage to cause an electrical breakdown at the defect site and thereby generating a breakdown-induced reflected pulse in the cable; at least one diagnostic sensor at the drive end of the cable for detecting the incident pulse and the breakdown-induced reflected pulse; and a transient recorder connected to the at least one diagnostic sensor to record the detected incident pulse and the detected breakdown-induced reflected pulse. The pulser can be a charge-line pulser or other short-pulse high-voltage pulser.

For the purpose of this disclosure, the electrical breakdown at the defect site resulting from the application of the high-voltage incident pulse can include the initial stages of the formation of the breakdown channel when the impedance is changing as well as the formation of a low-impedance path resulting from a fully formed spark channel. During all stages of the breakdown process, observable electrical, chemical, and acoustic events can be detected and analyzed to determine the location of the defect site. Therefore, the diagnostic sensor(s) can be both direct and indirect contact sensors, including voltage and current probes, current viewing transformers, magnetic field derivative or electric field derivative sensors, radio frequency (RF) sensors, acoustic sensors, and chemical sensors. Depending on the data to be gathered, these sensors can be placed at either or both ends of the cable or along the length of the cable.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 3 shows the results of a cable test for a 50-ohm RG-174/U coax cable using the PASD method.

FIG. 4 shows the results of a cable test for a 50-ohm RG-214/U coax cable using the PASD method.

FIG. 5 shows the results of a cable test for a 62-ohm twisted pair cable using the PASD method.

FIG. 6 shows the results of a cable test for a 44-ohm four-conductor cable using the PASD method.

FIG. 7 shows the results of a cable test for a 50-ohm RG-214/U cable using the PASD method.

FIG. 8 shows the results of a cable test for a 50-ohm RG-214/U cable using the PASD method.

FIG. 9 shows the results of a cable test for a nonuniform impedance, twisted pair cable using the PASD method.

DETAILED DESCRIPTION OF THE INVENTION

The method of cable testing by PASD relies on the development of a controlled electrical breakdown (spark) at a defect site of the cable, resulting from the injection of a short-duration high-voltage incident pulse into the cable. The electrical breakdown generates transient pulses that propagate in both directions of the cable from the site of the breakdown. These breakdown-induced pulses can be observed at either end of the cable with diagnostic sensors. The defect site location can be determined from the time delay between the incident and breakdown-induced pulses and the propagation characteristics of the cable using a time-of-arrival calculation.

Figure 1:
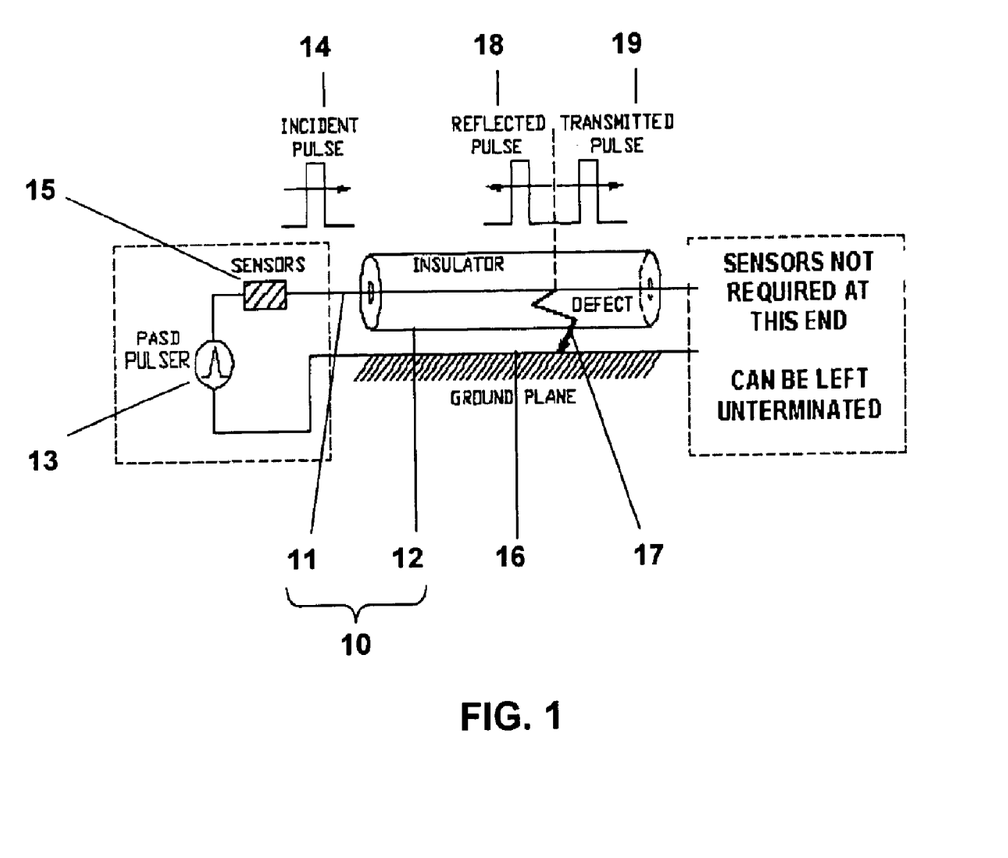
FIG. 1 shows a schematic illustration of the Pulse-Arrested Spark Discharge (PASD) apparatus for determining the location of a defect site in a cable.

In FIG. 1 is shown a schematic illustration of the PASD apparatus for locating a defect site 17 in a cable 10. In practice, wiring generally refers to a discrete single conductor wire with an AWG or 12 or smaller. Cabling generally refers to multi-conductor cable or a single conductor cable of 10 AWG or larger. For the purpose of this disclosure, wiring and cabling are used interchangeably and the term "cable" can refer to either a wire or a cable. A simple cable 10 can comprise a single wire conductor 11 surrounded by an insulator 12. A pulser 13 provides the short-duration high-voltage incident pulse 14 for injection into the drive end of the cable 10. The other, terminal end of the cable 10 can have a terminating load (not shown) or can be unterminated. One or more drive-end diagnostic sensors 15 and/or terminal end diagnostic sensors (not shown) can detect the incident pulse 14 and breakdown-induced reflected pulse 18 and breakdown-induced transmitted pulse 19. The diagnostic sensor(s) 15 can be connected to a transient recorder (not shown) to record the waveform of the cable response to the incident pulse 14.

According to the method of the present invention, a baseline waveform signature characteristic of the cable response without electrical breakdown can be obtained by applying an incident pulse 14 to the cable 10 at a voltage below the expected breakdown threshold. The baseline waveform signature can be recorded and stored by the transient recorder. The applied voltage of the incident pulse 14 can then be successively increased, using a step-stress approach, until an electrical breakdown (spark channel formation) between the wire conductor 11 and a return current path 16 occurs at the defect site 17. The return current path 16 can be, for example, a nearby metallic structure, the cable metallic sheath, or a nearby wire. The formation of the spark channel produces a rapid change of the cable impedance at breakdown, causing the breakdown-induced reflected pulse 18 to propagate toward the drive end and the breakdown-induced transmitted pulse 19 to propagate toward the terminal end of the cable 10 from the defect site 17. The breakdown-induced reflected pulse 18 can be observed at the drive end of the cable 10 by the diagnostic sensor(s) 15. Alternatively, the breakdown-induced transmitted pulse 19 can be detected by another diagnostic sensor(s) (not shown) at the terminal end of the cable 10.

The location of the defect site 17 can be determined from the time delay of the breakdown-induced reflected pulse 18 from the incident pulse 14 and propagation velocity of the pulses in the cable 10 using a time-of-arrival technique. The distance to the defect site 17 from the drive end of the cable 10 is given by $$\Delta L = v(t_{ref} - t_{inc})/2$$

where $t_{inc}$ is the time of arrival of the incident pulse 14 at the diagnostic sensor 15, $t_{ref}$ is the time of arrival of the breakdown-induced reflected pulse 18 at the diagnostic sensor 15, and v is the propagation velocity of the pulses. The propagation velocity can be determined by measuring the transit time for a pulse to travel in a similar undamaged cable of known length or other standard cable techniques.

Alternatively, the propagation velocity for a lossless cable can be estimated from $$v = c/(\mu \epsilon)^{1/2}$$

where c is the speed of light in vacuum, $\mu$ is the permeability of free space, and $\epsilon$ is the dielectric constant for the cable material (all values in MKS units). If a terminal end diagnostic sensor is used to detect the breakdown-induced transmitted pulse 19, the location of the defect site 17 from the terminal end of the cable can also be determined.

Variations in the time at which the defect site breaks down can cause errors in determining the defect site location. This is because the formation of the breakdown requires a finite time that is dependent on the relative level of over-voltage at the defect site 17. This delay is generally less than a few nanoseconds and is statistical in nature. The delay can be determined through arrival time measurements at the terminal end of the cable and statistically quantified. After a level is reached for which a breakdown is achieved, a known over-voltage level is used to reduce the time lag. Using the known statistics for time lag as a function of over-voltage, the test over-voltage can be selected to reduce the uncertainty in defect location.

Variation in time can also be attributed to how the selection of the propagation velocity parameter is applied. In cables where the return structure is in direct contact with the insulation associated with the cable under test, the propagation velocity is very consistent. Examples include coaxial cables and multi-conductor cables with only a few conductors and a single shield. In other cable geometries where the return conductor is separated from the test cable by other wires and air gaps, the overall propagation velocity may be nonuniform. Thus, calculation of the defect site location using a uniform propagation velocity can result in an error. Resolution of this error involves the use of existing techniques from inverse scattering. A low amplitude reflection and/or transmission measurement is made, where the cable responds linearly to the applied pulse. The dielectric profile of the cable is then reconstructed from these measurements. The resulting velocity profile can then be used to reduce uncertainty in the defect site location determination.

Controlled injection of the short-duration high-voltage incident pulse 14 is a key to the utility of the PASD method. Limiting the incident pulse width from a few nanoseconds to a few hundred nanoseconds controls the pulse energy. The pulse voltage can range from a few kV to tens of kV. As a result of the narrow pulsewidth, the energy dissipated in the electrical breakdown can be only a few millijoules, greatly limiting any further damage to the cable 10 at the defect site 17 caused by the cable testing. Minimizing the incident pulsewidth limits not only the energy associated with the incident pulse 14 but also the duration over which sufficient voltage is available to maintain electrical breakdown at the defect site 17. Longer pulsewidths will transfer higher amounts of energy and greatly increase the potential for insulator damage at the defect site 17.

The pulser 13 should preferably provide a very fast risetime, high-voltage incident pulse 14 to the test cable 10. For example, the pulser 13 can be a charge-line pulser, a lumped-element pulser, or an amplifier driven by a low-level voltage pulse source. The risetime of the incident pulse 14 is preferably less than 10 ns and more preferably less than 1 ns. For example, the pulser 13 can comprise a charged, high-voltage capacitor pulse-forming line (or transmission line) that can be rapidly discharged into the test cable 10 by a fast, low-inductance high-voltage switch. Such a charge-line pulser can provide a fast-rise rectangular incident pulse 14 and is reliable and inexpensive to fabricate.

Figure 2:
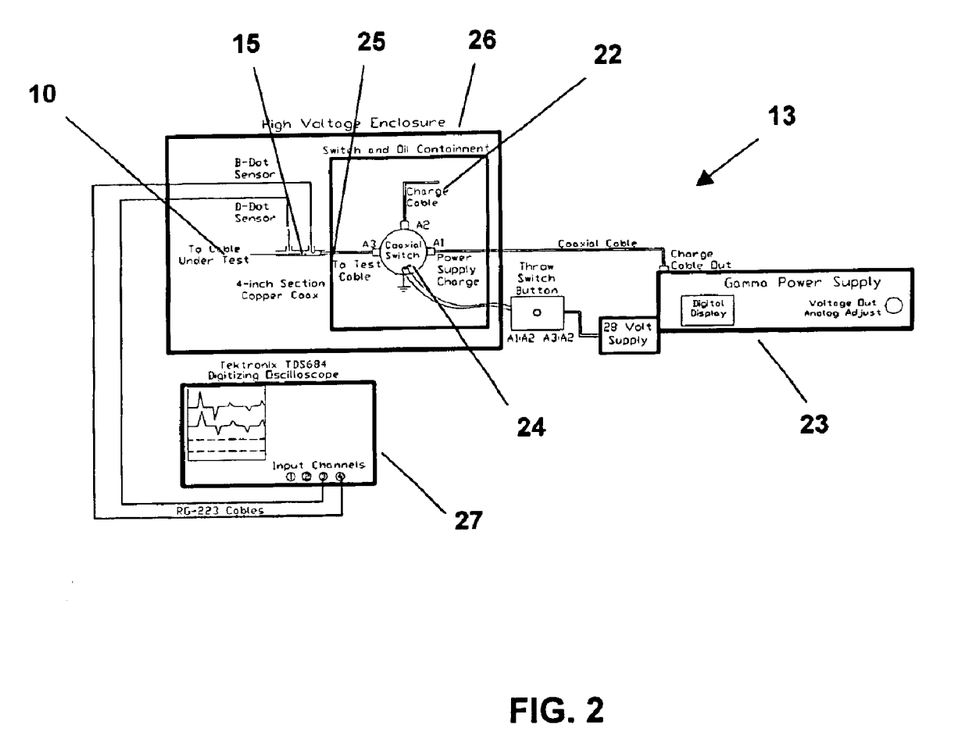
FIG. 2 shows a schematic illustration of a charge-line pulser.

FIG. 2 shows a schematic illustration of an exemplary charge-line pulser 13 for controlled injection of a short-duration high-voltage pulse 14 into the drive end of the test cable 10. A nominal 5-ns incident pulse 14 with an approximate 1-ns risetime can be produced with a 50-ohm GR-214/U coaxial charge-line cable 22 that is approximately 18 inches in length. Longer pulsewidths can be created by lengthening the coaxial charge-line cable 22 and shorter pulses by shortening the cable 22. The drive impedance, which is 50-ohms with the 50-ohm line, can be modified using parallel charge lines or higher or lower impedance coaxial cables (not shown). A high-voltage power supply 23 can be used to charge the charge-line cable 22 through a high-voltage switch 24. For example, the switch 24 can be a Kilovac (model K60C831) relay. The output of the switch 24 can be connected to the test cable 10 through a matched coax cable 25. For the best pulse shape and minimum risetime, the high-voltage switch 24 can be configured into a geometry that maintains the system impedance as closely as possible. The charge-line pulser 13 can be contained in a high-voltage enclosure 26.

The maximum voltage of the incident pulse 14 can be estimated based on the maximum anticipated electrical breakdown path for the cable 10 under test. The threshold voltage at which the electrical breakdown occurs and the rapidity of the breakdown is related to the separation distance between the drive wire conductor 11 and the return current path 16, and the risetime of the applied incident pulse 14. The applied pulse voltage required to initiate the electrical breakdown can be minimized by a return current path 16 that is in close proximity to the wire conductor 11. Additionally, locating the defect site 17 with relatively high precision is aided by the rapid formation of the electrical breakdown. Rapid breakdown produces fast risetime reflected and transmitted pulses 18,19 that are more easily detected by the diagnostic sensor 15.

Typically, the transmission line impedance of the various cables to be tested can vary over a significant range. Therefore, the impedance of the pulser 13 is preferably matched to the test cable 10. Impedance matching provides an efficient pulse injection, minimizing pulser to cable interface effects and simplifying waveform interpretation.

The incident pulse 14 can be generated by charging of the coaxial charge-line 22, after which the high-voltage switch 24 connects the energy stored in the charge-line 22 to the output coax cable 25. The incident pulse 14 can be injected into the test cable 10 either directly or indirectly. With direct injection, the cable 10 is physically connected to the pulser 13. Direct injection is probably applicable to the greatest variety of test conditions and is most efficient at coupling in pulses 14 of sufficiently high voltage. Alternatively, the incident pulse 14 can be injected indirectly by inductive or capacitive methods (not shown).

The coax cable 25 can have at least one drive-end diagnostic sensor 15 to monitor the incident pulse 14 that is injected into the test cable 10. The diagnostic sensor 15 can be of the direct or indirect contact type. Direct contact sensors, such as voltage probes, make a physical connection to the cable conductor 11. Examples of indirect contact sensors are current viewing transformers, magnetic field derivative sensors (B-dot type), and electric derivative field sensors (D-dot type). The indirect contact sensors can be placed in close proximity to or around the cable 10 being evaluated. Indirect sensors also have the advantage of being able to be moved along the length of the cable.

Diagnostic sensors at either or both ends of the cable 10 provide useful waveforms from which the defect site location can be estimated. The sensor waveforms can be recorded and stored by a transient recorder 27, such as a Tektronix 684A-digitizing oscilloscope, that is operatively connected to the diagnostic sensor(s) 15. In general, sensors are required at the drive end of the cable. Additional sensors (not shown) placed at the terminal end of the cable and/or along the cable provide additional information, which can be used to isolate the defect site location. Multiple sensors can also improve monitoring of signals in electrically noisy environments.

EXAMPLES

The charge-line pulser 13 shown in FIG. 2 was used to test representative end-of-life-cycle commercial and military aircraft cable assemblies using the PASD method described above. Table 1 describes the cables that were tested. Cable types tested included coaxial, twisted pair, and four-conductor cable with various types of damage developed during the life cycle of these aircraft cables.

TABLE 1

Cable description

| Cable Type | Manufacturer | Specifications | Defect |
|---|---|---|---|
| RG-174/U | Brand-Rex | 50-ohm coax | 360° Break in shield |
| RG-214/U | Delco | 50-ohm coax | Abrasion |
| P/N 2473 | Alpha | 62-ohm twisted pair | Abrasion |
| P/N 1772 | Alpha | 44-ohm four conductor | Abrasion |
| RG-214/U | Delco | 50-ohm coax | 1.2 mm pin in shield |
| RG-214/U | Delco | 50-ohm coax | 1 mm hole without pin |
| P/N M3232 | Manhattan CD | Nonuniform twisted pair | Abrasion |

Table 2 summarizes the damaged cable detection thresholds for the cables tested. The detection threshold is the incident pulse voltage at which a breakdown-induced reflected pulse having a detectable waveform damage signature is first observed. Detection thresholds were typically below 10 kV for a 5 ns wide rectangular incident pulse.

TABLE 2

Damaged cable detection thresholds

| Cable Type and Damage | Detection Threshold for 5-ns FWHM Pulse (kV) | Insulator Dielectric |
|---|---|---|
| RG-174/U Break in shield | 0.095 | Solid polyethylene |
| RG-214/U Abraded shield | 12.4 | Solid polyethylene |
| Alpha 2473 (TP) Abraded Insulation | 9.59 | High-density polyethylene |
| Alpha 1772 (FC) Abraded Insulation | 8.91 | High-density polyethylene |
| RG-214 pin-in shield | 6.9 | Solid polyethylene |
| RG-214 pin hole | 9.8 | Solid polyethylene |
| Nonuniform impedance (TP) | 4.5 | TBD |

Table 3 summarizes the defect site location accuracy for the cables tested. The cables were chosen to be 20 to 30 feet in length, since this is representative of typical cables on aircraft. Calculating the location of a defect site by the time-of-arrival technique requires the equivalent insulation dielectric constant $\epsilon$ to determine the propagation velocity. The manufacturer specified values of $\epsilon=2.25$ to 2.5 for the cables tested were independently verified by measuring the transit time of a pulse in a similar undamaged cable of known length. The defect site location accuracy was determined by comparing the actual physical location of the defect site, measured from the drive end, to the PASD-estimated defect site location. The estimated location of the site defect, as determined by the PASD method, typically agreed to within twelve inches of the actual location.

TABLE 3

Cable defect site location accuracy

| Cable Type and Damage | Cable Length (ft) | Measured Defect Location (ft) | PASD-Estimated Defect Location (ft) | Percent Agreement |
|---|---|---|---|---|
| RG-174 Break in shield | 24 | 19.2 | 19.8 | 3.1 |
| RG-214 abraded shield & insulation | 25.8 | 10.5 | 11.7 | 11.4 |
| Alpha 2473 (TP) insulation damage | 30.3 | 24.2 | 25.6 | 5.8 |
| Alpha 1772 (FC) insulation damage | 30.3 | 20 | 22.3 | 11.5 |
| RG-214 pin-in-shield | 30.3 | 8.4 | 9.3 | 10.7 |
| RG-214 pinhole | 30.3 | 22.2 | 23.8 | 7.2 |
| Nonuniform impedance (TP) | 15.6 | 12 | 11.7 | 2.5 |

FIGS. 3–9 show photographs of the defect site and recorded waveforms for the cables tested with the PASD method. The test cables 10 had a type-BNC, HBNC, N, HN, or an OSM (for the RG-174/U) connector placed at the drive end to interface with the 50-ohm output coax cable 25 of the charge-line pulser 13. A short was used at the terminal end of the test cable 10 to ensure that any residual charge would be dissipated after testing. Other load terminations, including open-circuit, can be used without interfering with pulse detection and defect site location. Baseline waveform signatures were obtained by applying a low-level pulse to the damaged cable below the threshold voltage or to a similar undamaged cable. A damage signature was detected by observing the change in the cable response waveform as the voltage of the incident pulse 14 was increased. The cable responses were observed with a D-dot derivative sensor 15 on the drive-end of the cable 10 and recorded with a Tektronix 684A-digitizing oscilloscope 27.

Figure 3A:
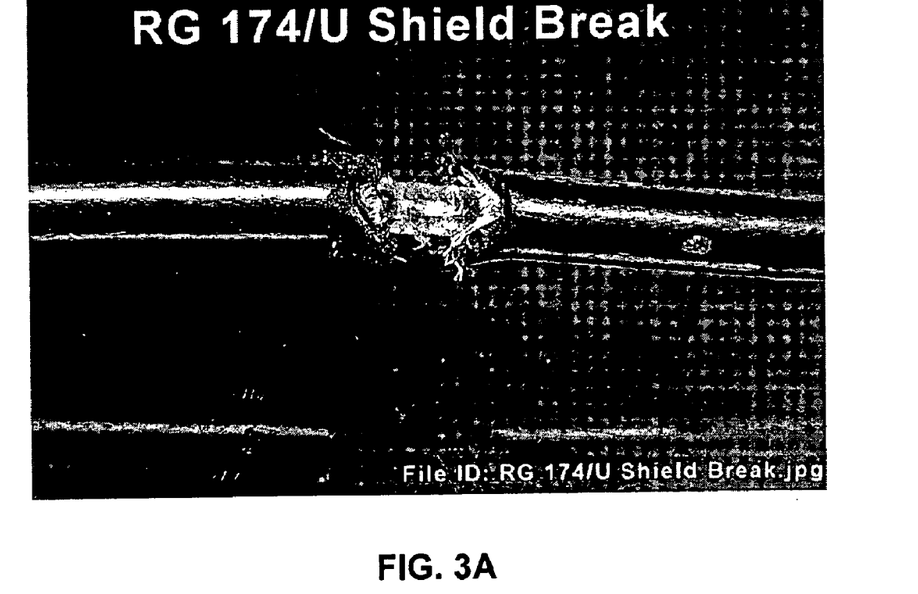
FIG. 3A shows a photograph of a shield break at the defect site.
Figure 3B:
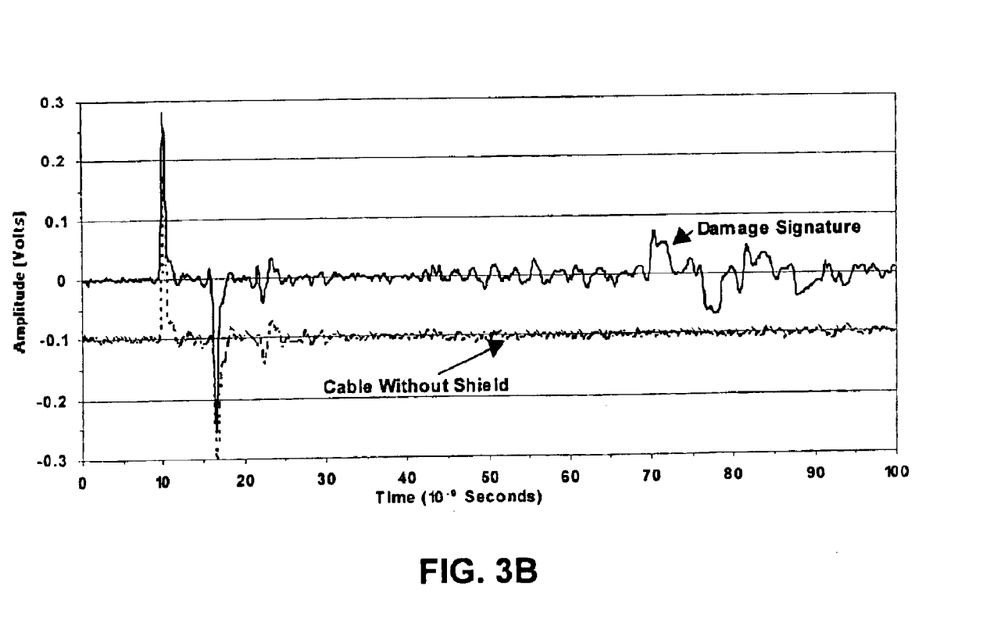
FIG. 3B shows the recorded waveforms of a damaged and an undamaged cable.

FIG. 3 shows the results of the cable test for the 24-ft. long Brand-Rex RG-174/U cable. The Brand-Rex RG-174U is a uniform-impedance, 50-ohm coax cable with a solid polyethylene insulator, typical of the type found on aircraft. In FIG. 3A is shown a photograph of a 360° shield break at the defect site. In FIG. 3B is shown in the lower waveform the baseline waveform signature that was recorded for a similar Brand-Rex GR-174/U cable without damage. The upper waveform in FIG. 3B was recorded for the damaged cable having the shield break defect shown in FIG. 3A. The D-dot derivative sensor detected an incident pulse at 10 ns for both the damaged and undamaged cables. The baseline waveform signature of the undamaged cable is relatively uneventful, except for some small amplitude noise and early time reflections from impedance mismatches at the relay-to-coax-cable junction. The damaged cable waveform displays a damage signature at about 70 ns, corresponding to the reflected pulse from the shield break defect site shown in FIG. 3A. Using the time delay of 60 ns between the incident and reflected pulses and a propagation velocity in the cable of about $6.7 \times 10^8$ ft/sec, the location of the defect site was estimated by the PASD method to be 19.8 feet from the drive end of cable. The estimated defect site location compared favorably to the physically measured defect location of 19.2 feet from the drive end of the cable.

Figure 4A:
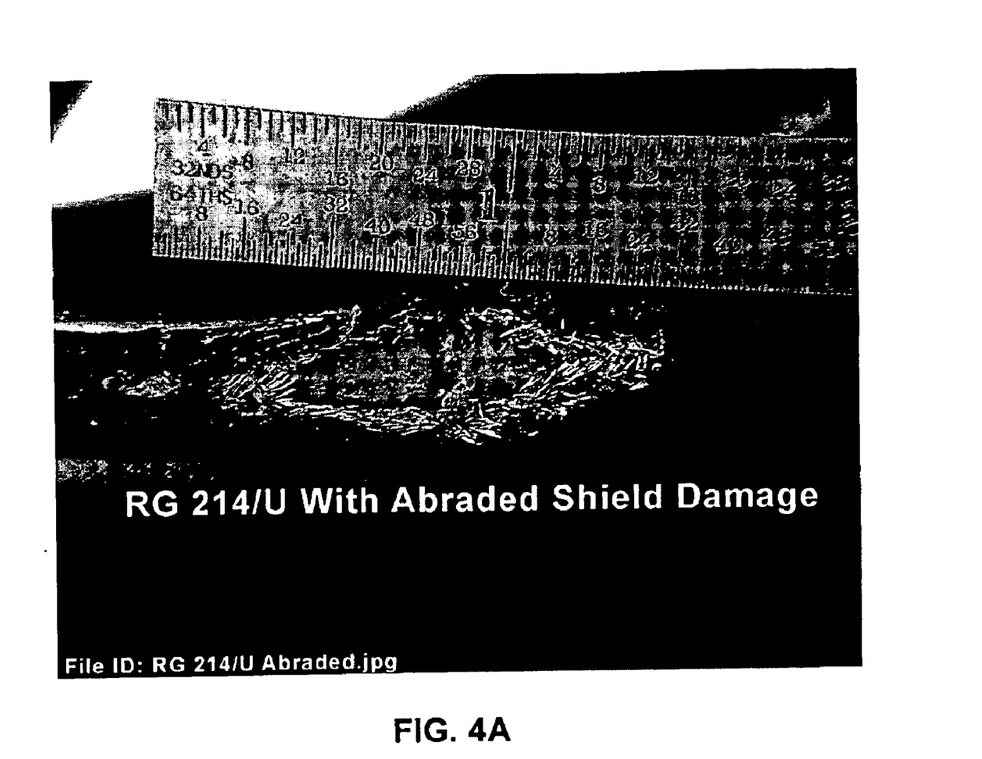
FIG. 4A shows a photograph of an abraded shield and insulation at the defect site.
Figure 4B:
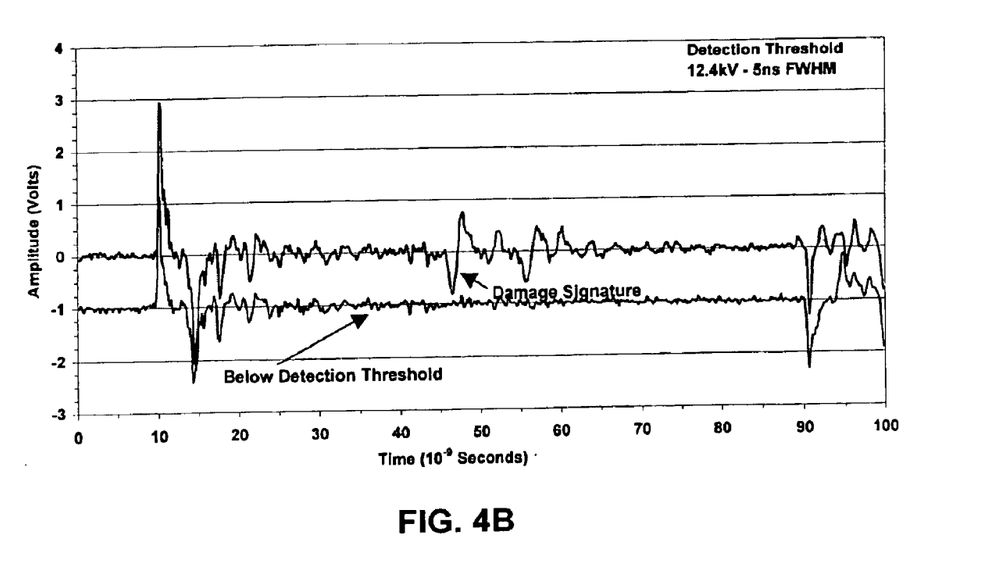
FIG. 4B shows the waveforms of the cable recorded above and below the detection threshold of the cable defect.

FIG. 4 shows the results of the cable test for the 50-ohm RG-214/U coax cable. FIG. 4A shows a photograph of the abraded shield and insulation at the defect site. FIG. 4B shows the waveforms of the cable recorded above and below the detection threshold. A damage signature was detected at about 46 ns with a 12.4 kV incident pulse, from which the defect site location was estimated to be at 11.7 feet from the drive end of the cable.

Figure 5A:
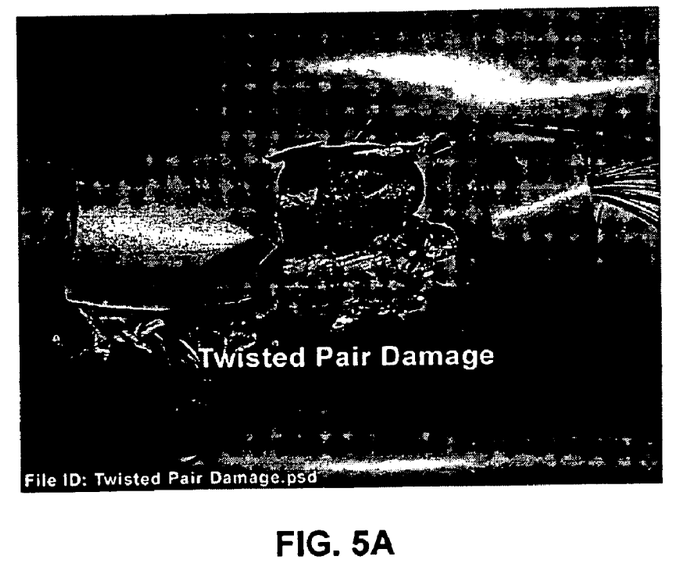
FIG. 5A shows a photograph of abraded insulation at the defect site.
Figure 5B:
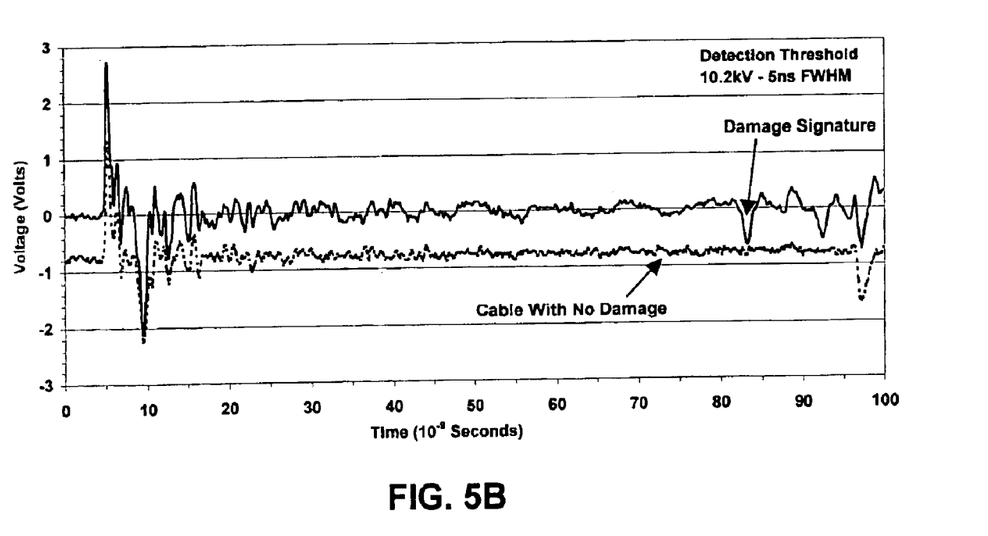
FIG. 5B shows recorded waveforms of a damaged and an undamaged cable.

FIG. 5 shows the results of the cable test for the 62-ohm twisted pair cable. FIG. 5A shows a photograph of the abraded insulation at the defect site. FIG. 5B shows recorded waveforms of the damaged and an undamaged cable. A damage signature was detected at about 83 ns with a 10.2 kV incident pulse, from which the defect site location was estimated to be at 25.6 feet from the drive end of the cable.

Figure 6A:
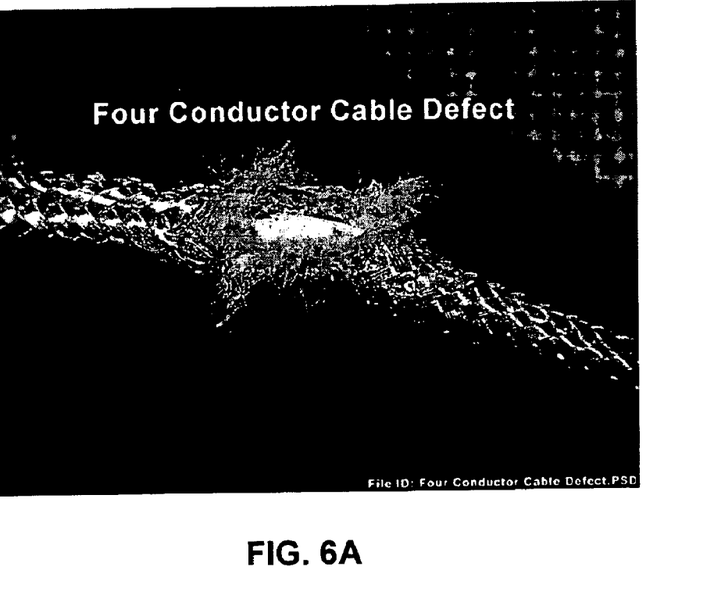
FIG. 6A shows a photograph of an abraded shield and insulation at the defect site.
Figure 6B:
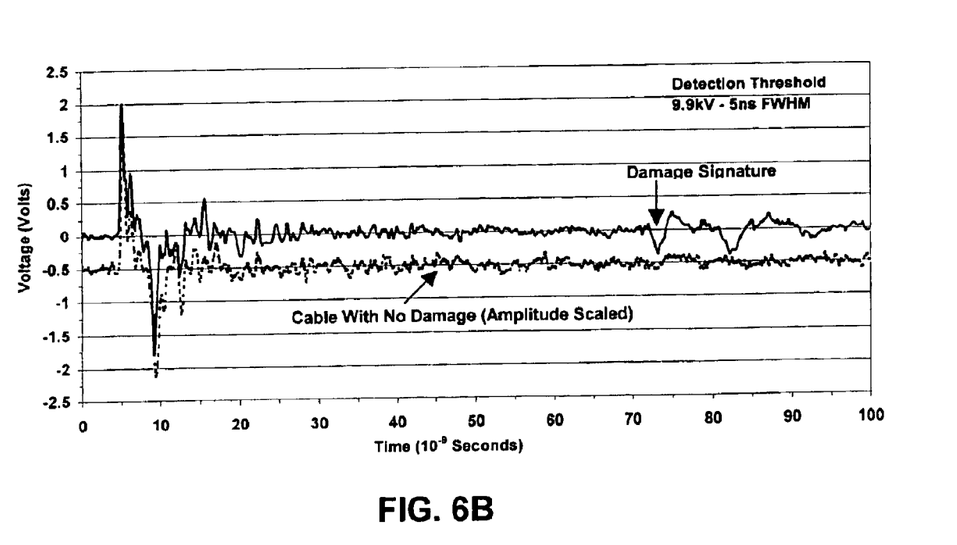
FIG. 6B shows recorded waveforms of a damaged and an undamaged cable.

FIG. 6 shows the results of the cable test for the 44-ohm four-conductor cable. FIG. 6A shows a photograph of the abraded sheath and insulation at the defect site. FIG. 6B shows recorded waveforms of a damaged and an undamaged cable. A damage signature was detected at about 72 ns with a 9.9 kV incident pulse, from which the defect site location was estimated to be at 22.3 feet from the drive end of the cable.

Figure 7A:
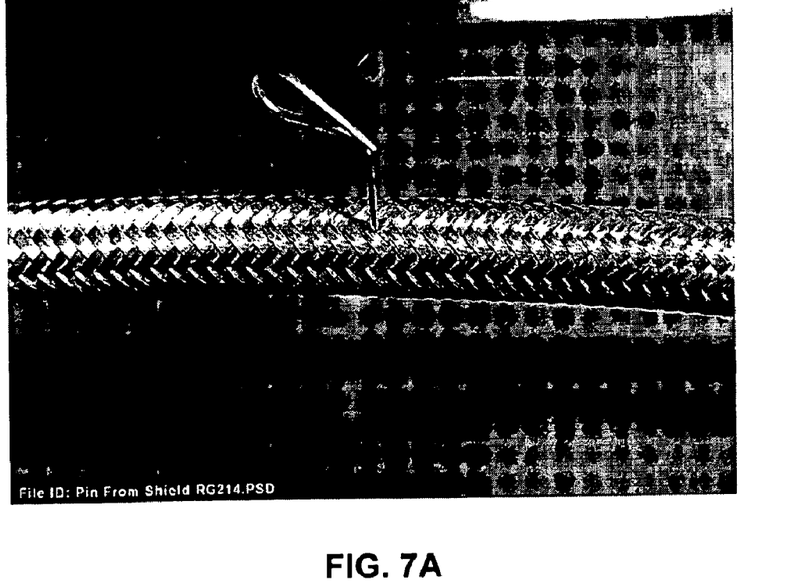
FIG. 7A shows a photograph of a pin-in-shield at the defect site.
Figure 7B:
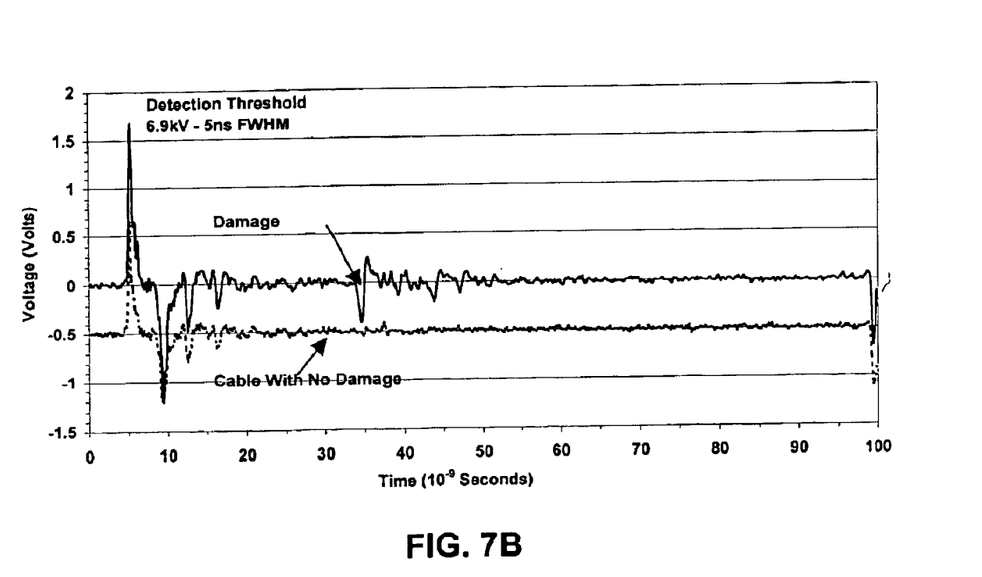
FIG. 7B shows the recorded waveforms for a damaged and an undamaged cable.

FIG. 7 shows the results of the cable test for the 50-ohm RG-214/U cable with the pin-in-shield defect. FIG. 7A shows a photograph of the 1.2 mm diameter pin penetrating the shield at the defect site. FIG. 7B shows the recorded waveforms for a damaged and an undamaged cable. A damage signature was detected at about 34 ns with a 6.9 kV incident pulse, from which the defect site location was estimated to be at 9.3 feet from the drive end of the cable.

Figure 8A:
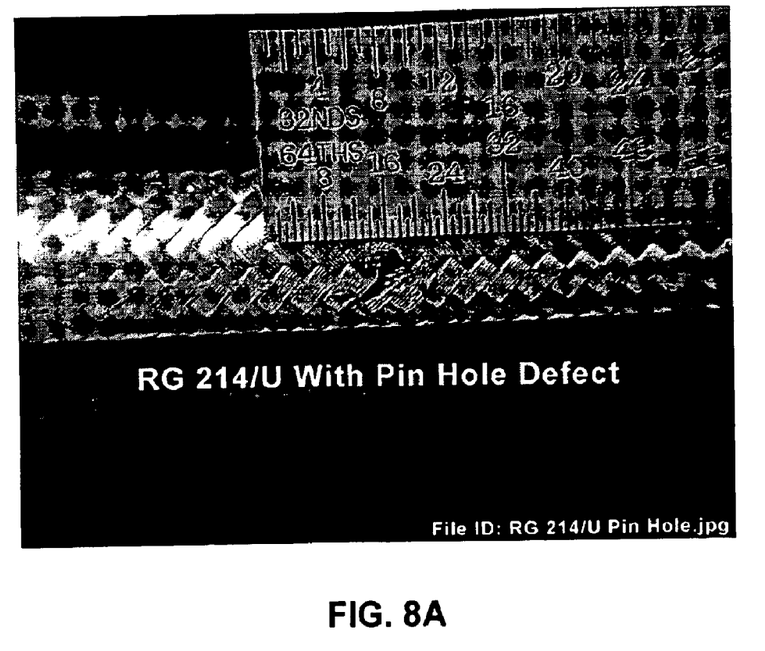
FIG. 8A shows a photograph of a pinhole at the defect site.
Figure 8B:
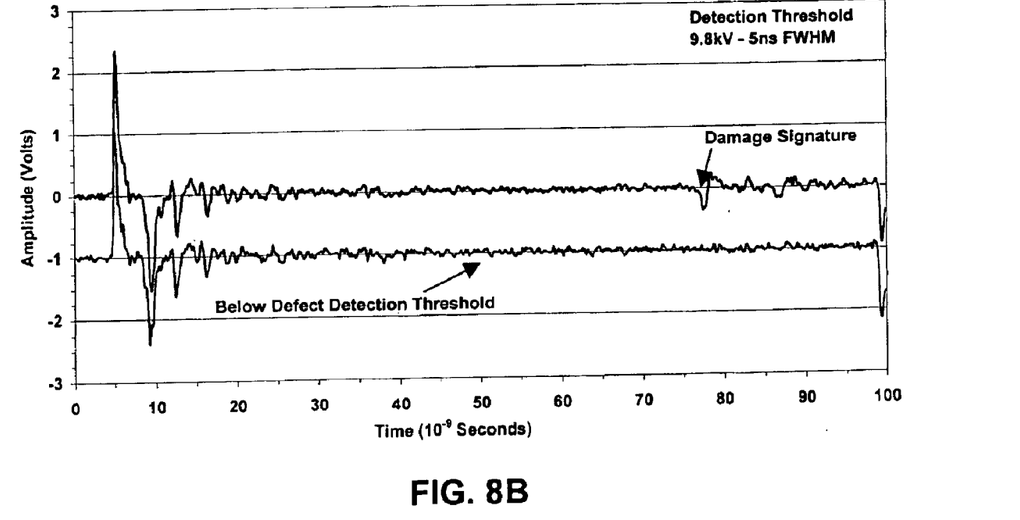
FIG. 8B shows the waveforms of the cable recorded above and below the detection threshold.

FIG. 8 shows the results of the cable test for the 50-ohm RG-214/U cable with the pinhole defect. FIG. 8A shows a photograph of a 1 mm diameter pinhole at the defect site. FIG. 8B shows the waveforms of the cable recorded above and below the detection threshold. A damage signature was detected at about 77 ns with a 9.8 kV incident pulse, from which the defect site location was estimated to be at 23.8 feet from the drive end of the cable.

Figure 9A:
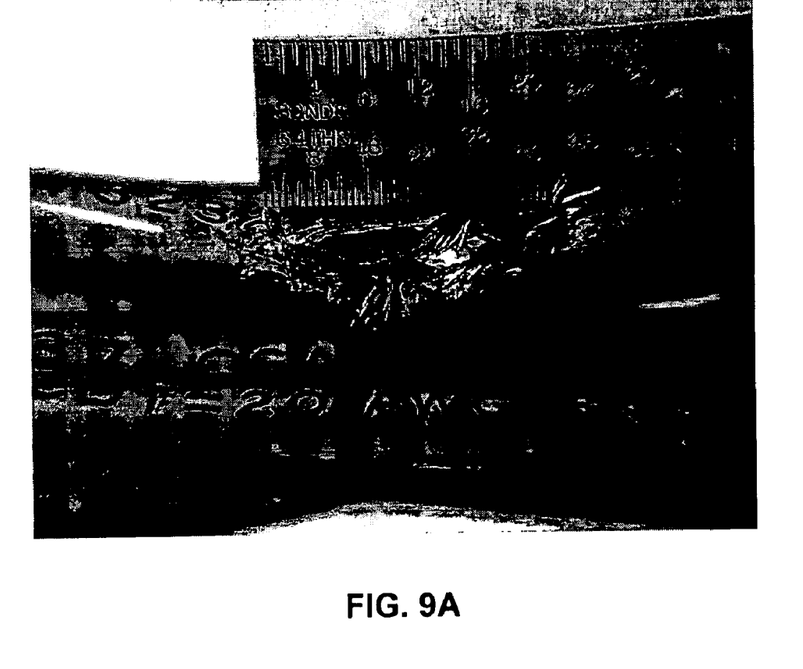
FIG. 9A shows an abraded shield and insulation at the defect site.
Figure 9B:
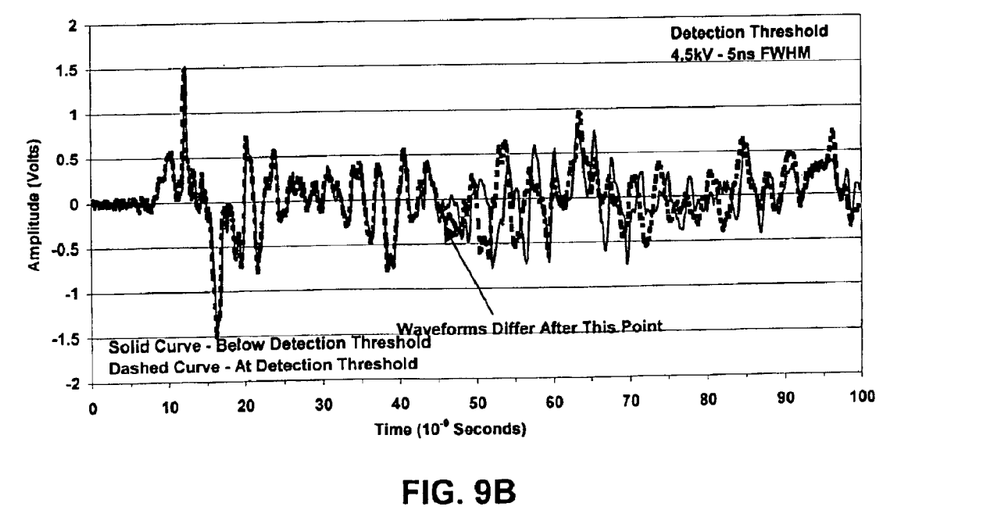
FIG. 9B shows the waveforms of the cable recorded above and below the detection threshold.

FIG. 9 shows the test results for the PASD method applied to a nonuniform impedance twisted-shielded pair cable. FIG. 9A shows the abraded sheath and insulation at the defect site. FIG. 9B shows the waveforms of the cable recorded above and below the detection threshold. This twisted pair cable represents a difficult cable to locate a defect site with accuracy. This is due to the many reflections from the nonuniform impedance along the length of the cable.

For cables other than coax, impedance nonuniformity will result in a complex wave signature due to multiple reflections inherent with the cable structure. However, if the system is linear, the cable response at voltages below where breakdown occurs at a defect site should not change as a function of voltage. When the voltage of the incident pulse is increased to the point that a breakdown occurs at the defect site, a change in the cable response can be identified as a possible damage signature. As shown in FIG. 3B, this waveform change occurred at about 43 ns with a 4.5 kV incident pulse, from which the defect site location was estimated to be at 11.7 feet from the drive end of the nonuniform impedance twisted pair cable.

Modifications to the Basic PASD Method

These results indicate that the basic PASD method can be used to determine the location of a variety of defects in different types of cables. Modifications of the basic PASD method described above include the use of an external ionization radiation source, magnetic fields, pressure, surrounding media, and/or multiple pulses. These modifications—individually or together—can cause a change in the voltage necessary to initiate the breakdown process and reduce the effects of unrelated electrical noise. The intent of these modifications is to reduce the energy dissipated at the defect site 17 and improve the detectability and location accuracy of the defect site 17.

External ionization can be provided by, for example, ultraviolet light to X-radiation sources. The higher energy sources (e.g., X-rays) enable the radiation to penetrate thin panels or conduits, potentially making it applicable to aircraft, enclosed conduit systems, or other applications where the cable is largely inaccessible. The ionizing radiation source can create free electrons or ions in the gas surrounding the defect site 17. These free charges enable the electrical discharge at the defect site 17 to initiate at a lower voltage by creating a pre-ionized conducting channel between the wire conductor 11 and the current return path 16. The availability of free charges also reduces the delay and risetime of the electrical breakdown, providing improved resolution of the defect site location.

A directed beam of ionizing radiation may be preferred when irradiation of the entire cable system to be tested is impractical. The directed-beam radiation source can be scanned along the cable run, providing additional diagnostic information regarding defect site location. For example, the damage signature using the basic PASD method may be too weak or ambiguous to provide a definitive determination of the defect site location. Scanning the radiation source along the cable path can provide a strong damage signature change when the radiation source passes over the defect site 17. In general, a repetitive lower (pre-breakdown) pulser can be used to detect the defect site 17 with external ionization.

Multiple pulses can also be used to lower the threshold voltage and generate additional diagnostic information. The multiple-pulse method can use at least one pre-pulse to create electrons and ions at the defect site 17 through the corona process. The pre-pulse induces pre-ionization of the gas at the defect site 17, similar to the external radiation source. After the pre-pulse has ionized the region surrounding the defect site 17, the breakdown incident pulse 14 arrives at the defect site 17 and drives the defect into electrical breakdown. However, the breakdown incident pulse 14 must occur arrive at the defect site 17 the pre-pulse ionization dissipates due to the recombination of electrons and ions. The pre-pulse can be of lower voltage than the incident pulse 14 and can have a lower rise-time and duration. The pre-pulse may also be either positive or negative polarity with adjustable dwell between the pre-pulse and the breakdown incident pulse 14. Like the external ionization method, the pre-pulse method can reduce further damage at the defect site 17 and decrease the risetime of the breakdown, thereby improving the accuracy of the defect site location.

Multiple pulses can also be injected from both ends of the cable. In this case, the pulse injection would be timed such that the pulses arrive simultaneously at the defect site 17. When the pulses both reach the defect site 17 there will be a voltage doubling effect as the two waveforms pass. Where a single pulse would not have sufficient voltage to result in a breakdown, the combined pulses can result in a breakdown. Due to the narrow pulse widths used, this multi-pulse method is intended to reduce the voltage to which the entire cable is exposed. The higher breakdown voltage is localized to the defect site 17. This multi-pulse method may be especially practical where pulse injection breakdown at the injection point is a problem when only one end of the cable is driven with a single high-voltage incident pulse 14.

If multiple incident pulses are injected at the same or differing voltages (with respect to each incident pulse), signal-extraction techniques can be used to identify very low-level repetitive breakdown events. Location information can thereby be extracted from waveforms what would otherwise be undetectable with the basic PASD method. Prior to the development of a spark, a corona may also discharge from the damage site. The multiple pulse method with signal-extraction techniques can be used to detect defect sites 17 during the corona phase, before the cable is driven to the point of full electrical breakdown, thereby limiting collateral damage.

The use of local external magnetic fields can be used to increase the breakdown voltage, thereby helping to locate defect sites 17 in complex systems. The magnetic fields can be provides by electro- or permanent magnets. The required induction levels can be on the order of one Tesla.

Additionally, gases and/or liquids can be introduced into the system to lower the breakdown voltage associated with a defect site 17. In general, such a modification requires a geometry wherein the gas or liquid can be easily contained. Furthermore, the gas or liquid should be chosen to not result in other degradations such as corrosion or the introduction of an overall safety hazard.

Other types of diagnostics are capable of identifying and locating the defect site 17 when electrical discharge occurs or before the onset of breakdown, foe example when corona emission is occurring. Additional techniques to detect the breakdown or pre-breakdown include radio frequency (RF) signature detection and analysis, chemical sensing, and acoustic detection. Electrical breakdown and corona discharge generates an RF signal that radiates away from the defect site 17. In addition, chemical compounds, such as ozone, and an acoustic signal can also be generated at the defect site 17 by the electrical breakdown. The chemical compounds and acoustic signal can be detected with appropriate sensors, either fixed or moveable, to provide additional information about the defect site location.

The embodiments of the present invention have been described as an apparatus and method for cable testing by Pulsed-Arrested Spark Discharge. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for determining the location of a defect site in an electrical cable, comprising:

injecting into the drive end of the cable a short-duration incident pulse having sufficient voltage to cause an electrical breakdown at the defect site and wherein the incident pulse has energy of less than 1 joule, thereby generating a breakdown-induced reflected pulse in the cable;

detecting the incident pulse with at least one diagnostic sensor at the drive end of the cable and recording the arrival time of the incident pulse;

detecting the breakdown-induced reflected pulse with the at least one diagnostic sensor at the drive end of the cable and recording the arrival time of the breakdown-induced reflected pulse; and estimating the location of the defect site from the time delay between the arrival times of the incident and breakdown-induced reflected pulses at the drive end of the cable and the propagation velocity of the pulses in the cable by a time-of-arrival technique.

2. The method of claim 1, wherein the risetime of the incident pulse is less than 10 nanoseconds.

3. The method of claim 1, wherein the risetime of the incident pulse is less than 1 nanosecond.

4. The method of claim 1, wherein the pulsewidth of the incident pulse is less than 500 nanoseconds.

5. The method of claim 1, wherein the pulsewidth of the incident pulse is less than 100 nanoseconds.

6. The method of claim 1, wherein the pulsewidth of the incident pulse is less than 10 nanoseconds.

7. The method of claim 1, wherein the voltage of the incident pulse is less than 100 kilovolts.

8. The method of claim 1, wherein the voltage of the incident pulse is less than 10 kilovolts.

9. The method of claim 1, wherein the electrical breakdown at the defect site further generates a breakdown-induced transmitted pulse in the cable and wherein the method further comprises detecting the breakdown-induced transmitted pulse with at least one diagnostic sensor at the terminal end of the cable and estimating the location of the defect site from the arrival times of the incident pulse at the drive end and of the transmitted pulse at the terminal end of the cable and the propagation velocity of the pulses in the cable by a time-of-arrival technique.

10. The method of claim 1, further comprising ionizing a gas surrounding the defect site with a radiation source prior to the arrival of the incident pulse at the defect site.

11. The method of claim 10, wherein the radiation source is a directed beam source and wherein the step of ionizing further comprises scanning the cable with the directed beam source.

12. The method of claim 10, wherein the radiation source comprises an ultraviolet light or X-radiation source.

13. The method of claim 1, further comprising injecting at least one pre-pulse into the cable before the incident pulse to preionize gas at the defect site and wherein the incident pulse arrives at the defect site before the preionization dissipates.

14. The method of claim 1, further comprising injecting a second pulse into the terminal end of the cable to provide voltage enhancement at the defect site.

15. The method of claim 1, further comprising injecting at least one additional incident pulse into the drive end of the cable and using signal-extraction techniques to detect the defect site.

16. The method of claim 1, further comprising applying a magnetic field to the defect site with a magnetic field generator prior to injection of the incident pulse to increase the breakdown voltage of the defect site.

17. The method of claim 16, wherein the step of applying the magnetic field further comprises scanning the cable with the magnetic field generator.

18. The method of claim 16, wherein the magnetic field generator comprises a permanent magnet or an electromagnet.

19. The method of claim 1, further comprising immersing the cable in a liquid or gas prior to injection of the incident pulse to modify the breakdown voltage at the defect site.

20. The method of claim 1, further comprising changing the atmospheric pressure of the cable environment prior to injection of the incident pulse to modify the onset of electrical breakdown at the defect site.

21. The method of claim 1, further comprising detecting a radio frequency signal propagating from electrical breakdown at the defect site.

22. The method of claim 1, further comprising detecting chemical compounds created by the electrical breakdown at the defect site.

23. The method of claim 1, further comprising detecting an acoustic signal propagating from the electrical breakdown at the defect site.

24. An apparatus for determining the location of a defect in a cable, comprising:
   a pulser for injecting a short-duration incident pulse into a drive end of the cable, the incident pulse having sufficient voltage to cause an electrical breakdown at the defect site and wherein the pulser can generate the incident pulse having energy of less than 1 joule, thereby generating a breakdown-induced reflected pulse in the cable;
   at least one diagnostic sensor at the drive-end of the cable for detecting the incident pulse and the breakdown-induced reflected pulse; and
   a transient recorder connected to the at least one diagnostic sensor to record the detected incident pulse and the detected breakdown-induced reflected pulse.

25. The apparatus of claim 24, wherein the pulser comprises a charge-line pulser, lumped element pulser, or low-voltage pulse amplifier.

26. The apparatus of claim 24, wherein the pulser can generate the incident pulse having a risetime of less than 1 nanosecond.

27. The apparatus of claim 24, wherein the pulser can generate the incident pulse having pulsewidth less than 10 nanoseconds.

28. The apparatus of claim 24, wherein the pulser can generate the incident pulse having a peak voltage of greater than 10 kilovolts.

29. The apparatus of claim 24, wherein the at least one diagnostic sensor comprise a direct contact sensor or an indirect contact sensor.

30. The apparatus of claim 24, wherein the at least one diagnostic sensor comprises a voltage probe, current viewing transformer, magnetic field derivative sensor, or electric field derivative sensor.

31. The apparatus of claim 24, further comprising at least one diagnostic sensor at the terminal end of the cable for detecting a breakdown-induced transmitted pulse generated by the electrical breakdown at the defect site.

32. The apparatus of claim 24, wherein the incident pulse is injected directly or indirectly into the cable.

33. The apparatus of claim 24, further comprising a radiation source to ionize a gas surrounding the defect site.

34. The apparatus of claim 33, wherein the radiation source is a directed beam source.

35. The apparatus of claim 33, wherein the radiation source is an ultraviolet or X-radiation source.

36. The apparatus of claim 24, further comprising a second pulser for injecting a second pulse into the terminal end of the cable to provide voltage enhancement at the defect site.

37. The apparatus of claim 24, further comprising a magnetic field generator to increase the breakdown voltage at the defect site.

38. The apparatus of claim 24, further comprising means for detecting a radio frequency signal propagating from the electrical breakdown at the defect site.

39. The apparatus of claim 24, further comprising means for detecting chemical compounds created by the electrical breakdown at the defect site.

40. The apparatus of claim 24, further comprising means for detecting an acoustic signal propagating from the electrical breakdown at the defect site.

41. The method of claim 1, wherein the incident pulse has energy of less than 100 millijoules.

42. The method of claim 1, wherein the incident pulse has energy of less than 20 millijoules.

43. The method of claim 1, further comprising injecting at least one additional pulse into the cable having a voltage below the voltage to cause electrical breakdown at the defect site, to provide a baseline waveform signature at the at least one diagnostic sensor.

44. The method of claim 42, wherein the detecting of the breakdown-induced reflected pulse comprises detecting a damage signature by comparing the waveform produced by the incident pulse at the at least one diagnostic sensor to the baseline waveform signature.

45. The apparatus of claim 24, wherein the pulser can generate the incident pulse having pulsewidth less than 100 nanoseconds.

46. The apparatus of claim 24, wherein the pulser can generate the incident pulse having a peak voltage of greater than 1 kilovolt.

47. The apparatus of claim 24, wherein the pulser can generate the incident pulse having energy of less than 100 millijoules.

48. The apparatus of claim 24, wherein the pulser can generate the incident pulse having energy of less than 20 millijoules.

* * * * *